United States Patent [19]

Krimmel

[11] Patent Number: 4,596,998
[45] Date of Patent: Jun. 24, 1986

[54] DISPLAY WITH A NUMBER OF LIGHT-EMITTING SEMICONDUCTOR COMPONENTS

[75] Inventor: Eberhard F. Krimmel, Pullach, Fed. Rep. of Germany

[73] Assignee: Siemens Aktiengesellschaft, Berlin & Munich, Fed. Rep. of Germany

[21] Appl. No.: 632,300

[22] Filed: Jul. 19, 1984

[30] Foreign Application Priority Data

Aug. 10, 1983 [DE] Fed. Rep. of Germany ....... 3328902

[51] Int. Cl.$^4$ ............................................ H01L 33/00
[52] U.S. Cl. .......................................... 357/17; 357/2; 357/16; 357/30; 357/65
[58] Field of Search ................... 357/17, 32, 65, 91, 357/68, 31, 16, 19, 2, 30, 55; 315/169.3; 313/500, 501

[56] References Cited

U.S. PATENT DOCUMENTS 4,317,686 3/1982 Anand et al. .......................... 357/91

Primary Examiner—James W. Davie
Assistant Examiner—Georgia Y. Epps
Attorney, Agent, or Firm—Hill, Van Santen, Steadman & Simpson

[57] ABSTRACT

A display with a number of light-emitting semiconductor components such as a luminescent diode has as low as possible an optical cross-talk. It is constructed on a substrate on the rear side of which self-adjusting area portions of an original entire-area metallization have been left as counter electrodes. Material of the substrate bordering on the rear side in the intervals between the counter electrodes is made greatly absorbing or poorly reflecting, preferably through conversion into an amorphous state.

6 Claims, 5 Drawing Figures

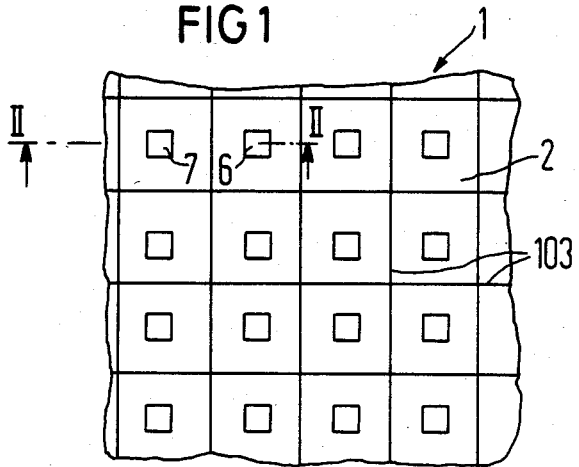
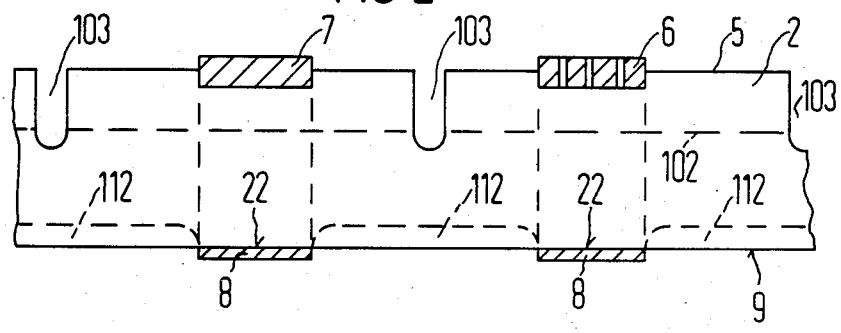
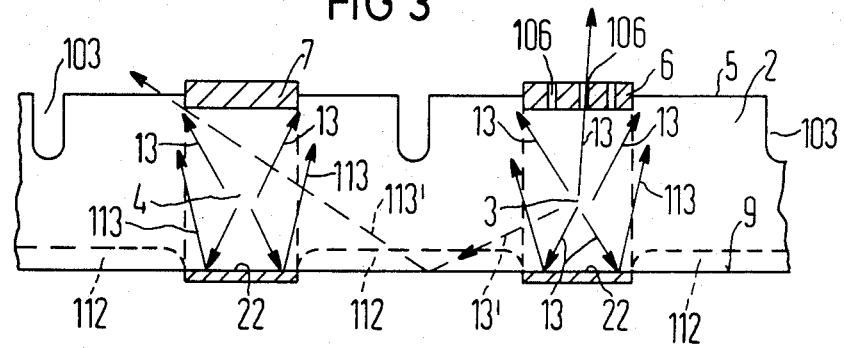

DISPLAY WITH A NUMBER OF LIGHT-EMITTING SEMICONDUCTOR COMPONENTS

BACKGROUND OF THE INVENTION

The present invention relates to a display comprising a plurality of light-emitting or light-detecting semiconductor components in an essentially monocrystalline substrate transmissive to generated light. A front side of the substrate is provided as a light exit surface on which at a spacing from one another respective electric contact electrodes for the individual semiconductor components are provided. On a rear side of the substrate corresponding individual respective counter electrodes are provided in correspondence with the front side electrodes.

In German patent application No. P 33 10 362.3 of Mar. 22, 1983, incorporated herein by reference, a method for the manufacture of a display comprising a number of luminescent diodes or photo-receiving diodes is described which are preferably arranged in an array. In such an array, it is important that individual luminescent diodes and/or photo-diodes do not mutually influence one another in an undesired fashion, i.e. that optical cross-talk is reduced to at least a permissible minimum extent.

The luminescent diodes and/or photo-diodes in such an array, are arranged on or in a substrate member comprised of semiconductor material and at intervals from one another. Upon activation of a specific luminescent diode (in contrast with non-activated adjacent luminescent diodes) only this one activated luminescent diode is to be perceived as light-emitting. The corresponding applies to photo-diodes in which only the one specific diode, for example, is to emit a detector signal. This optical selectivity stands in contrast to the effect that, in the case of substrates which are greatly transparent for the radiation to be emitted, or for the radiation to be received, a more or less great reflectivity occurs on the interior surface of its rear side. The respective front side of the substrate is that particular side through which the light, in accordance with specifications, is to be emitted or received.

A specific reflection on the rear side of the substrate is thoroughly desirable per se insofar as it extends in areal fashion to the region of the respective diode and does not effect any radiation overshooting, or any such receiving sensitivity which renders the diode more or less distinguishable in relation to adjacent diodes. Such a desired reflection can be provided as a consequence of the presence of the respective counter-electrode applied on the rear side of the respective diode.

In order to avoid the above-described undesired optical cross-talk, in the above referred to German application, the elimination of an entire-surface metal layer initially present from the manufacture, except for the counterelectrodes, is provided for in the surface areas of the rear side of the substrate. In this German patent application, for this purpose it is proposed to conduct a light radiation through the substrate with a wave length for which the substrate is transparent, which is operated in a pulse-wise fashion, and which is so intensity-strong that the respective area fractions of the rear-side metal layer are at least initially melted, but preferably entirely eliminated. The electrodes on the front side of the substrate thus act in a self-adjusting fashion as masks, so that the counter electrode portions of the original metal layer of the rear side remain within the shadow effect projection of the contacts of the front side.

The result of the manufacturing method of the above cited German application is a substrate which has on the front side and the rear side oppositely disposed electrodes and counter electrodes for the individual light-optical semiconductor components. The interstices of the rear side of the substrate between the counter electrodes are essentially free of a reflecting metal layer. Such an arrangement, although manufactured according to different, but considerably more complicated, methods has even been known per se.

SUMMARY OF THE INVENTION

It is an object of the present invention to find a further improvement regarding reduction of optical cross-talk for such a basically known arrangement.

This object is achieved for a display formed of a plurality of light-emitting or light-detecting semiconductor components by providing at intervals between the counter electrodes on the rear side of the substrate at regions of the semiconductor material bordering on the rear side, that such regions are strongly absorbing for generated light relative to the remainder of the substrate.

The idea underlying the present invention is to design the display in such a fashion that not only in the intervals between the counter electrodes is a reflective coating of the rear side of the substrate eliminated or not at all present, but that furthermore measures are undertaken through which the high light reflection existing due to the refractive index jump at the interface between the semiconductor material of the substrate and the air bordering on the rear side of the substrate becomes insignificant. This idea accordingly also applies to other material instead of air bordering on the rear side of the substrate. According to the invention, the layer of the substrate bordering on the rear side of the substrate in the region of the intervals is altered in such a fashion that the originally essentially monocrystalline material of the substrate is amorphous there with a continuous transition layer to the monocrystalline substrate. It is therefore possible that, for radiation striking from the interior of the substrate on the rear side of the substrate, an extremely strongly absorbing layer with random small jumps of the complex refractive index is present. This eliminates the influence of the known reflectivity of a refractive index jump as indicated above. An essentially continuous transition from the originally monocrystalline state to the final amorphous state of the substrate material in these intervals is particularly favorable so that the complex refractive index then continously varies.

A preferred technique for the subsequent creation of such an amorphous state is the application of an implantation with ions or electrons which have, as is known, a relatively limited penetration depth in the material of the substrate. In the case of the implantation, an effective profile of the conversion to the amorphous state which results is so typical, that the use of an implantation for creation of the amorphous state can be clearly inferred from the completed display. Preferably the dimensioning of the depth of the amorphous state zone is dimensioned from one or two wavelengths of the light emitted or detected by the display. Accordingly, the wavelength dimension in the material of the substrate is decisive for this purpose.

In the preceding and in the patent claims there is mention of "light"-emitting, "-sensitive", and "light"-exit surface, and the like. The term "light" is not restricted here to the visible optical range but rather is intended also to denote untraviolet light and, in particular, the ultrared or infrared wavelength region. The term "light" in terms of the invention is to be broadly understood as "light" emission or detection conducted with the aid of semiconductor components, and the reflection of which in the substrate can generate an optical cross-talk.

The present invention is also not restricted to displays manufactured according to the above discussed German application. It is also applicable to displays in which the individual counter electrodes have been otherwise manufactured on the rear side of the substrate as individual contact spots.

The present invention is also advantageous for displays with perforated electrodes on the front side of the substrate. Such perforations of the electrodes of the front side can be provided in order to allow not only radiation to issue out which has been emitted laterally of the electrodes in the respective diode of the substrate, but also to allow radiation to be detected by the electrode to enter into the substrate.

For embodiments with electrodes perforated in this fashion on the front side of the substrate, in case of the application of the manufacture method according to the above cited German patent application, it is however at least very advantageous to provide such a dimensioning of the diameters or openings respectively of the perforations which act with a sufficiently great diffraction or bending effect on that particular radiation which is radiated (in pulse-wise fashion) onto the front side of the substrate for the purpose of eliminating a metal layer originally present between the necessary counter electrodes of the rear side. Such a diffraction or bending effect causes the desired shadow effect of the electrode on the front side (having a masking effect) to occur in a sufficiently effective manner in the final result in spite of the perforations present in the surface of the electrodes of the front side.

BRIEF DESCRIPTION OF THE DRAWINGS

FIG. 1 shows a schematic plan view of the invention;

FIG. 2 shows a cross-sectional view;

FIG. 3 shows a corresponding cross-sectional view; and

DESCRIPTION OF THE PREFERRED EMBODIMENTS

Figure 4:
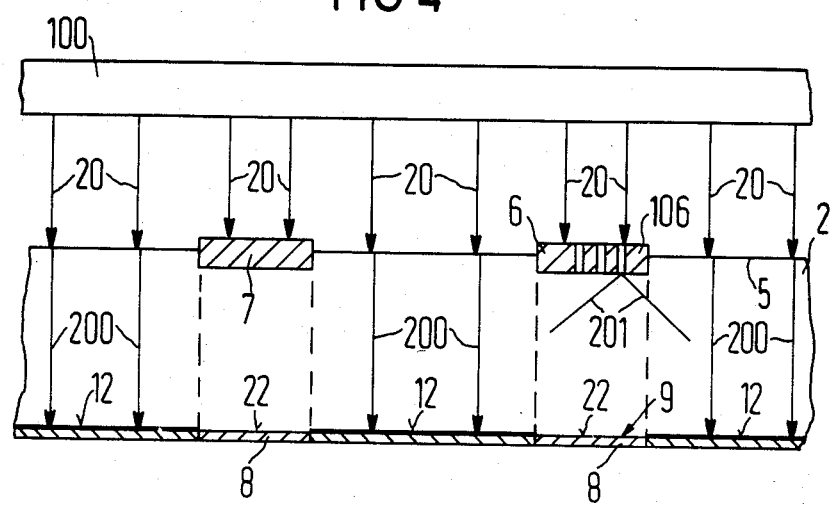
FIGS. 4 and 5 show cross-sectional views corresponding to FIGS. 2 and 3 with details regarding steps of the manufacture process.

FIG. 1 shows the schematic plan view of a section of an array 1 comprising light-emitting diodes arranged in a grid or matrix relative to one another. Of these diodes, in the plan view of FIG. 1, only those electrodes can be seen which are disposed on the front side of the substrate, of which two electrodes are referenced 6 and 7.

The cross-section II in FIG. 1 is reproduced with FIG. 2. Arranged opposite the electrodes 6 and 7 of the front side 5 of the substrate 2 are electrodes on the rear side 9 of the substrate. With reference numeral 22, area portions or surface regions of the rear side 9 of the substrate are designated which are covered with the counter electrodes 8 and in whose region radiation reflection occurs for radiation which strikes the surface regions 22 from the interior of the substrate 2.

The broken line 102 refers to the approximate position of a pn-junction within the substrate 2. The pn-junction serves the purpose of radiation generation for light emitting diodes and conversion of incident radiation into electric signals for photodiodes. Incisions or trenches 103 applied in the substrate member which are merely illustrated in the form of lines in FIG. 1 serve as insulation of the individual diodes with electrodes 6 and 7 from one another.

In the region of the rear side 9 of the substrate 2, in the intervals between the counter electrodes 8 or area portions 22, zones 112 are illustrated. In these zones 112, according to the invention the originally at least essentially monocrystalline material of the substrate 2 is converted to an amorphous state preferably through an implantation effect destroying the lattice of the crystal.

The illustration of FIG. 3, which is basically the same view as FIG. 2, illustrates the radiation conditions which result according to the invention. Light radiation 13, 13' for example, generated in the regions 3 and 4 in the substrate, is emitted either directly to the front side 5 or is emitted to the rear side 9 as a reflected radiation 113. Radiation 13', however, which reaches an amorphous region 112 of the substrate 2 as a consequence of the reflection reduction obtained therein, is virtually not reflected and a light ray as indicated with 113' is eliminated. What is achieved is that a viewer of the front side 5 of the substrate can ascertain light radiation generated in the region 3 of the substrate only in the region of the respective diode, i.e. in the region of electrode 6. Upon reflection on the rear side 9, radiation 113 otherwise reflected per se outside the area portions 22, however, does not occur and no optical cross-talk occurs in the region of the diode with the non-activated diode to which the electrode 7 of the front side 5 belongs.

For the electrode 6 an advantageous further development of the invention is illustrated; namely, that electrode 6 exhibits openings 106 through radiation 13 (as illustrated in FIG. 3) can pass.

Figure 5:
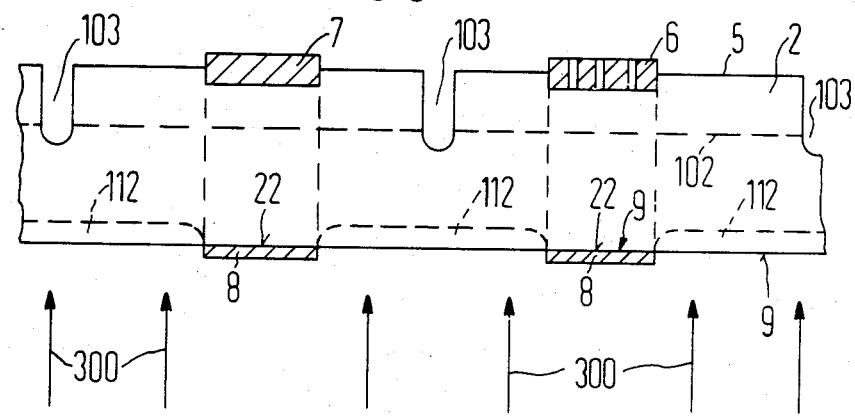

FIGS. 4 and 5 show illustrations which relate to the manufacture of an array of the invention (according to FIG. 1). The illustrations again proceed from the section of FIG. 1 corresponding to FIG. 2. Only for the electrode 6 are openings 106 illustrated, as in FIG. 3. These openings 106 are then present in practice (insofar as they are provided) in the case of all electrodes of the front side 5 of the substrate 2.

FIG. 4 shows as the first manufacture step, the method according to the aforementioned German application in which, proceeding from a pulsed light source 100, radiation is radiated onto the surface 5 of the substrate 2. The radiation 200 not shaded by the electrodes 6 and 7 strikes the interior side of the rear side 9 of the substrate 2; namely, in the regions 12 between the area portions 22. As already described in the German application, as a result of the impinging radiation 200 on the metal coating of the rear side of the substrate 2 (illustrated in an entire-surface fashion in FIG. 4) only the counter electrodes 8 illustrated in FIG. 2 still remain. In the region of area portions 12, the material of the original metal layer is eliminated by the radiation 200.

Radiation 20 passing through the openings 106 of the electrode 6, as a consequence of the intentionally narrow dimensioning of the cross-section of these openings 6, undergoes such a great diffraction or bending effect on the radiation 20 that virtually only diffusely directed radiation 201 still emerges from a respective opening 106. The shadow effect, desired for the surface portion 22 of the electrode 6 for self-adjusting, and in spite of openings 106, is also preserved to an entirely sufficient extent.

The openings 106 are so dimensioned that radiation 20 passing through the openings is diffracted or bent in such a sufficiently great manner that the shadow effect is preserved.

FIG. 5 shows the additional manufacture step of an array according to the invention. Reference numeral 300 refers to an entire-area implantation irradiation (with a dosage of e.g. $10^{15}$ cm$^{-2}$ silicon or oxygen ions with energies of e.g. 300 keV of the rear side 9 of the substrate 2. In the region of the counter electrodes 8, due to the shading effect, no implantation occurs in the substrate 2. However, in the area portions of the rear side 9 of the substrate which are free of counter electrodes, the implantation radiation penetrates the zones 112 in which, through crystal lattice destruction, with the aid of the energy of the implanted particles, essentially the amorphous state of the material of the substrate 2 is produced.

Although various minor changes and modifications might be proposed by those skilled in the art, it will be understood that I wish to include within the claims of the patent warranted hereon all such changes and modifications as reasonably come within my contribution to the art.

I claim as my invention:

1. An array of light-active semiconductor components for light-emitting or light-detecting, comprising:
    a plurality of individual light-active semiconductor components in an at least essentially monocrystalline semiconductor material substrate transmissive to light, a front side of said substrate being provided as a light transmissive surface on which at a spacing from one another, respective front side electric contact electrodes of said individual components are provided;
    on a rear side of said substrate corresponding individual respective counter electrodes being provided in alignment relative to said respective front side electrodes;
    in said substrate, a light-active zone being disposed substantially at a PN junction in proximity to said front side; and
    at intervals between said counter electrodes, regions of said semiconductor material of said substrate zone bordering on the rear side and rearwardly of the PN junction being strongly absorbing for generated light relative to a remainder of the substrate.

2. An array according to claim 1 wherein said semiconductor material of said substrate in said regions at said intervals having at least essentially an amorphous property, an essentially continuous transition from an essentially monocrystalline material of said substrate to said regions with said amorphous property being present.

3. An array according to claim 2 wherein a transition from said essentially monocrystalline state of said material of said substrate to said essentially amorphous property of said regions has a progression corresponding to an implantation.

4. An array according to claim 2 wherein a depth of said regions having said essentially amorphous property measured in a direction perpendicular to said rear side of said substrate is one to two wavelengths of said generated light in said material of said substrate.

5. An array according to claim 1 wherein said electrodes on said front side of said substrate have openings forming an areawide distributed perforation of said electrodes, said openings having diameters sufficiently small such that light in a wavelength range of said transmission capability of said material of said substrate undergoes diffraction upon passage through said openings.

6. A light-active semiconductor component system for light-emitting or light-detecting, comprising:
    a substantially monocrystalline substrate transmissive to light and having located therein a plurality of light-active semiconductor components;
    each light-active semiconductor component including a front side first electrode on a front side of said substrate and a corresponding second electrode at a rear side of said substrate opposite said front side first electrode;
    a light-active zone substantially between said first and second electrodes and comprising a pn junction;
    isolation means provided in said substrate between adjacent light-active semiconductor components; and
    regions rearwardly of the PN junction at intervals between said rear side second electrodes and beginning at said rear side of said substrate and proceeding towards said PN junction over a distance substantially less than a thickness of said substrate, a material of the semiconductor being substantially amorphous in said regions so that it is strongly absorbing for generated light relative to a remainder of the substrate and has random small jumps of a complex refractive index so that said refractive index substantially continuously varies, whereby light at said adjacent light-active zones and received at said regions in said intervals is substantially absorbed.

* * * * *